United States Patent
Thomas

(10) Patent No.: US 8,294,523 B2
(45) Date of Patent: Oct. 23, 2012

(54) LOW DISTORTION CASCODE AMPLIFIER CIRCUIT

(76) Inventor: Clive Thomas, Moreleta Park (ZA)

(*) Notice: Subject to any disclaimer, the term of this patent is extended or adjusted under 35 U.S.C. 154(b) by 45 days.

(21) Appl. No.: 13/062,697

(22) PCT Filed: Sep. 8, 2009

(86) PCT No.: PCT/AU2009/001173
§ 371 (c)(1),
(2), (4) Date: Mar. 8, 2011

(87) PCT Pub. No.: WO2010/028429
PCT Pub. Date: Mar. 18, 2010

(65) Prior Publication Data
US 2011/0163810 A1     Jul. 7, 2011

(30) Foreign Application Priority Data
Sep. 11, 2008 (ZA) .................................. 08/7842

(51) Int. Cl.
*H03F 3/04* (2006.01)
(52) U.S. Cl. ......... 330/311; 330/296; 330/310; 330/136
(58) Field of Classification Search .................. 330/311, 330/296, 310, 136
See application file for complete search history.

(56) References Cited

U.S. PATENT DOCUMENTS

| | | | | |
|---|---|---|---|---|
| 4,484,147 A * | 11/1984 | Metz | ............................. | 330/156 |
| 4,496,909 A * | 1/1985 | Knapp | ......................... | 330/277 |
| 4,520,324 A * | 5/1985 | Jett et al. | ....................... | 330/285 |
| 4,663,599 A * | 5/1987 | Patch | ............................ | 330/311 |
| 5,587,687 A * | 12/1996 | Adams | .......................... | 330/253 |
| 6,803,824 B2 * | 10/2004 | Rategh et al. | ................. | 330/302 |
| 7,135,929 B1 * | 11/2006 | Costa et al. | ................... | 330/296 |

* cited by examiner

*Primary Examiner* — Patricia Nguyen
(74) *Attorney, Agent, or Firm* — Darren Gardner

(57) ABSTRACT

An audio amplifier circuit has a first cascode stage configured as a voltage gain stage and having an input for an audio signal, and an output. The circuit has a second cascode stage configured as a unity gain or near unity gain stage and having an input to receive an output from the first cascode stage, and a low impedance output to drive an output stage of an audio power amplifier. The first cascode stage has a first, input transistor having an input biased to a predetermined bias voltage, and a second, output transistor arranged to drive the second cascode stage. The first, input transistor of the first cascode stage may have a common-emitter configuration, and the second, output transistor may have a common-base configuration. The invention extends to an audio amplifier which includes a circuit of the invention.

7 Claims, 7 Drawing Sheets

LOW DISTORTION CASCODE AMPLIFIER CIRCUIT

BACKGROUND OF THE INVENTION

THIS invention relates to a audio amplifier circuit, and to an audio power amplifier incorporating the audio amplifier circuit.

Many designs for audio amplifiers have been proposed, with varying degrees of success. Currently, it is considered desirable to minimise circuit complexity as far as practically possible, and to avoid the use of overall negative feedback in high fidelity audio amplifiers. Real-world amplifier designs tend to trade off various aspects of performance against one another, and against cost, in order to offer performance that is optimised in a desired area.

The greater majority of existing designs exhibit distortion characteristics which render negative feedback mandatory in order to lower the overall distortion to acceptable levels. This has the unfortunate effect of increasing phase distortion to an unacceptable degree. There is therefore a need for amplifier designs which have a characteristic distortion low enough to forego negative feedback, therefore presenting a more phase linear output signal.

It is an object of the invention to provide an alternative low distortion audio amplifier circuit.

SUMMARY OF THE INVENTION

According to the invention there is provided an audio amplifier circuit comprising:
  a first cascode stage configured as a voltage gain stage and having an input for an audio signal, and an output;
  a second cascode stage configured as a unity gain or near unity gain stage and having an input to receive an output from the first cascode stage, and a low impedance output to drive an output stage of an audio power amplifier;
the first cascode stage comprising a first, input transistor having an input biased to a predetermined bias voltage, and a second, output transistor arranged to drive the second cascode stage.

The first, input transistor of the first cascode stage may have a common-emitter configuration, and the second, output transistor may have a common-base configuration.

Preferably, the bases of each transistor in the first cascode stage are biased independently to a predetermined DC bias voltage.

The input of the first cascode stage is preferably isolated from the base of the first transistor by a capacitor and preferably also by a resistor.

The second cascode stage may be configured as a White's cascode comprising two transistors, each being biased to a predetermined DC bias voltage.

Further according to the invention there is provided an audio power amplifier comprising an audio amplifier circuit as defined above, and further comprising an output stage arranged to be driven by the audio amplifier circuit and configured as a unity or near-unity gain stage which effectively operates as a voltage to current transducer.

DESCRIPTION OF PREFERRED EMBODIMENTS

Figure 1:
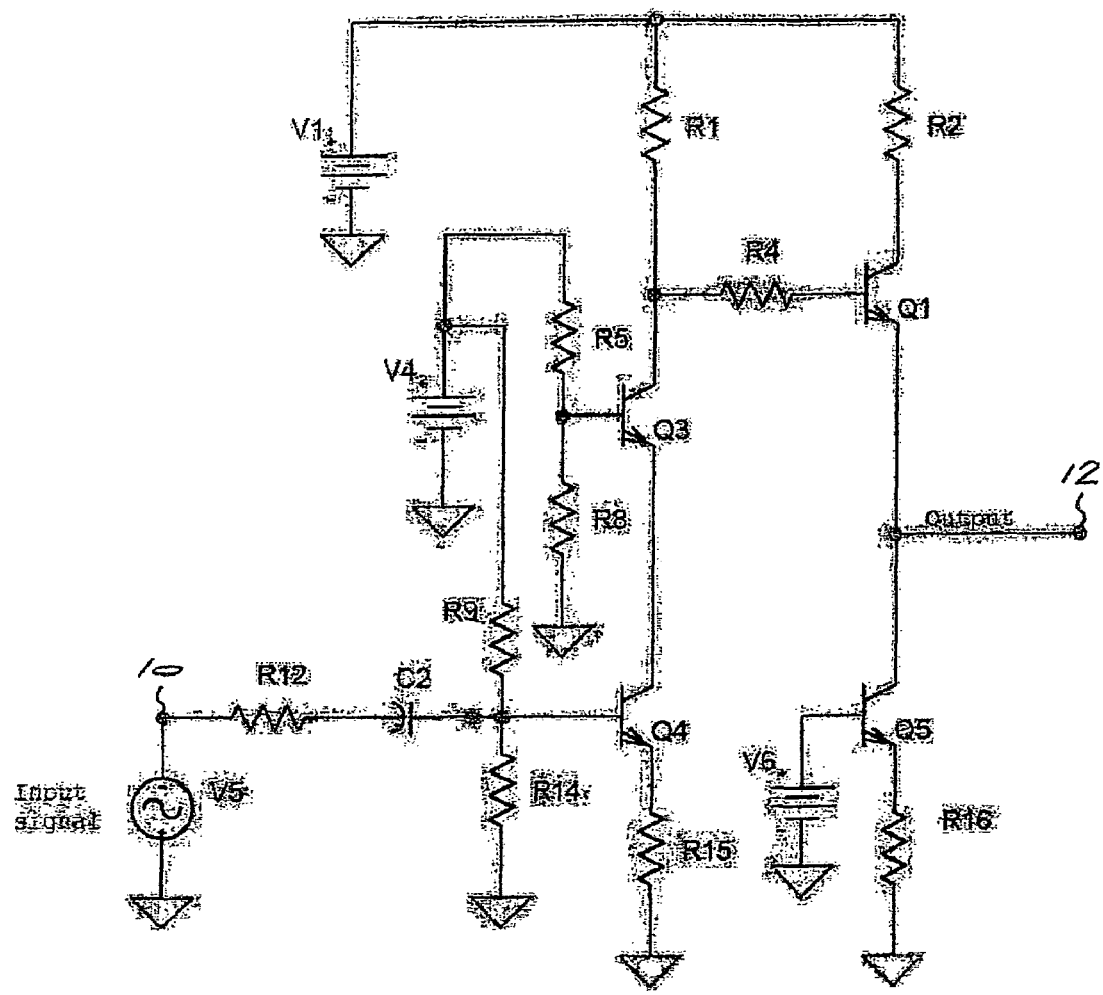
FIG. 1 is a schematic circuit diagram of a two-stage cascode amplifier according to the invention.

The schematic circuit diagram of FIG. 1 shows a two-stage cascode amplifier without negative feedback, the first cascode stage of which is a voltage gain stage which amplifies an audio input signal with very low distortion, and the second cascode stage of which operates at unity gain, providing a low impedance output to drive an output stage for an audio amplifier.

The first cascode stage of the circuit is constructed with transistors Q3 and Q4, with gain ratio resistors R1 and R15. The gain of the stage is determined by R1/R15, and this would normally in an audio amplifier application be set to a ratio of approximately 60, which is an adequate gain ratio, given a design which does not employ negative feedback. In amplifier circuits employing overall negative feedback, the gain of this stage would have to be higher by a factor corresponding to the amount of feedback. The signal input is at the base of the lower transistor Q4 of the pair, with the base of the upper transistor Q3 being fixed at an exact DC voltage determined as being the correct bias voltage for the selected transistor type. This bias voltage is determined by the ratio of two resistors R5 and R8 with respect to a regulated and smoothed DC supply V4.

An innovative aspect of the circuit is the provision of a bias point for the input at the base of the transistor Q4, determined by the ratio of two resistors R9 and R14 with respect to the supply V4. The addition of this bias point allows the cascode stage to be configured so as to deliver the minimum possible distortion by using the most linear portion of the gain curve for the transistor Q4. A series resistor R12 and a series capacitor C2 between the input 10 and the base of the transistor Q4 allow the input to the transistor Q4 to be completely decoupled from the input signal in both DC and AC senses, thereby allowing the bias point at the base of the transistor Q4 to be freely selected.

The output of the first cascode stage is at the collector of the transistor Q3.

The second cascode stage is configured as a White's cascode, with the signal input at the transistor Q1 rather than at the transistor Q5 as would be the case for a conventional cascode. In order to ensure that the base of the transistor Q1 is able to float to an appropriate level, a resistor R4 is inserted between the output of the first cascode stage and the base of the transistor Q1. The output 12 of the second cascode stage is between the emitter of the transistor Q1 and the collector of the transistor Q5.

The base of the transistor Q5 is set to an exact DC bias voltage V6, this being determined as being the appropriate bias level for minimum distortion for the transistor type chosen. The load resistors R2 and R16 should be of the same value and should be specified so as to allow optimal current through the transistors Q1 and Q5, taking into account the type of transistor chosen, to allow operation in the most advantageous operating region of these transistors.

The main DC power supply for the circuit, V1, must be chosen so as to allow adequate voltage swing for the output level required. For example, should an audio output voltage of 100V peak to peak (equivalent to approximately 35V r.m.s.) be desired, it will be necessary for the supply V1 to provide a voltage of approximately 170V DC. The reason for this is that in order to avoid distortion on the output signal resulting from the signal in the cascode circuit, the signal must stay in the linear region of the cascode which is only approximately 65% of the supply voltage. This supply voltage must be of very high quality, as the power supply rejection ratio of this cascode circuit is lower than equivalent amplification circuits such as long-tail pairs. The regulation of this supply must also be extremely good, as the current demand of the White cascode circuit varies with output signal amplitude.

In order that a supply voltage of 150V or more may be used at V1, the choice of transistors for Q1, Q3, Q4, Q5 must be such that the allowable collector-emitter voltage of the device may be in excess of half the power supply voltage, and for safe operation and an adequate range of allowable bias values the allowable base-emitter voltage must also be in excess of half the supply voltage.

The bias values in this circuit are critical for correct operation, as is shown in the following examples with reference to the plots of FIGS. 2 to 6.

In all the examples below, the input waveform was a near-perfect sinusoidal wave with frequency 12 kHz and amplitude 1.4V.

EXAMPLE 1

In a particular circuit, keeping all other values, components and bias points constant, the bias point on the base of the transistor Q4 was first set to 1.9V.

Figure 2:
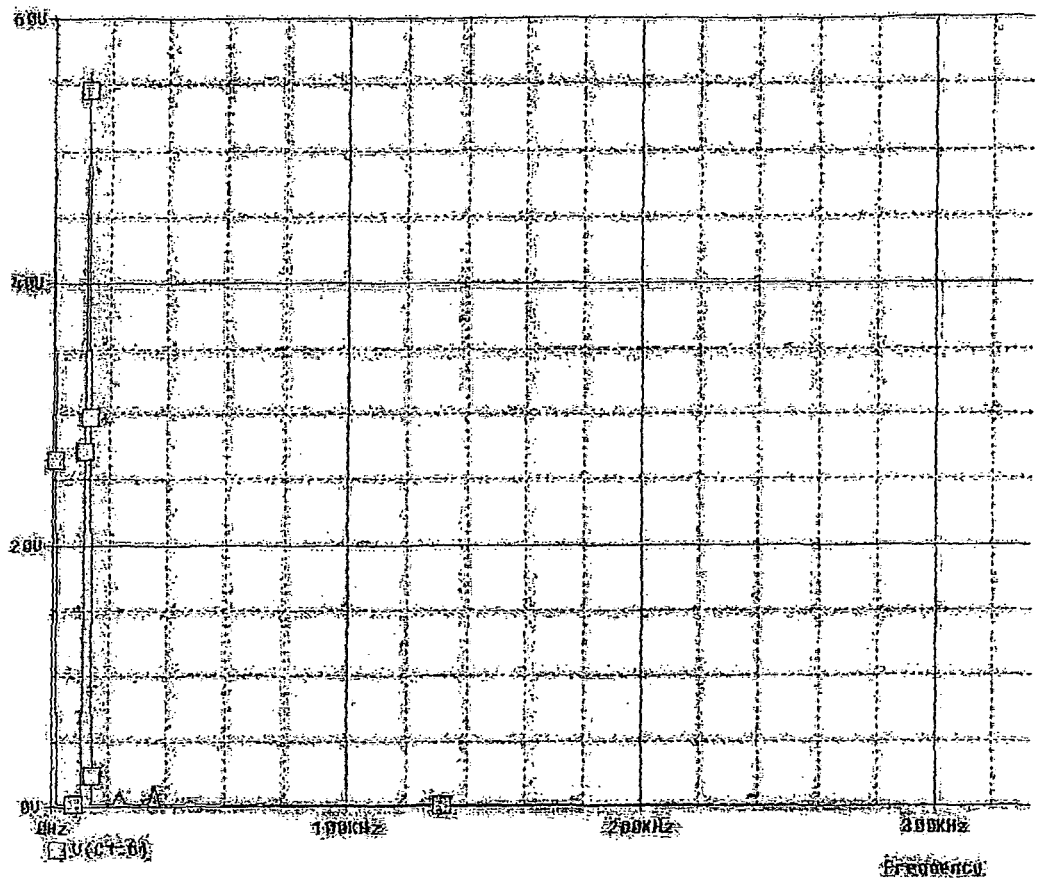
FIGS. 2 to 6 are FFT plots showing the performance of the amplifier with varying bias settings.
Figure 3:
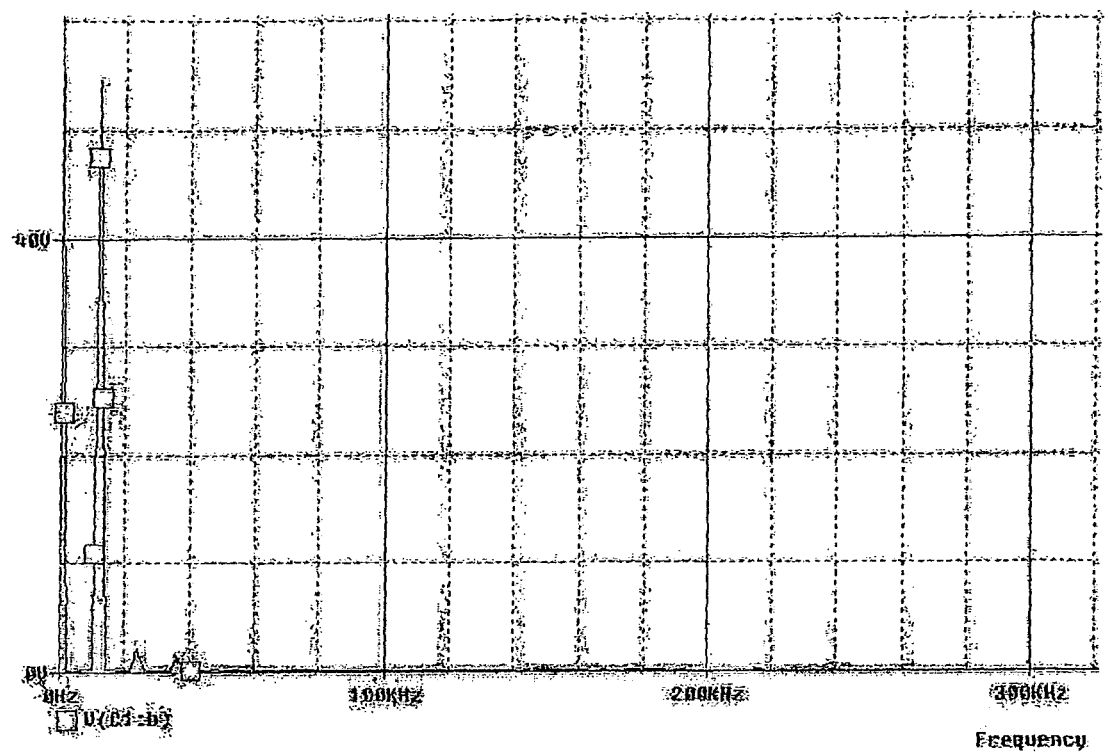

FIG. 2 shows an FFT (fast Fourier transform) plot of the resulting output waveform. The above bias setting yielded a signal to noise ratio of 31.4 dB, with an output amplitude of 55.9V r.m.s. The bias was then adjusted to 1.72V, which yielded the FFT plot of FIG. 3. Here, a signal to noise ratio of 28.1 dB was measured, with an output waveform amplitude of 54.6V r.m.s. Thus, it can be seen that a change of less than 10% in the bias value results in a reduction in the signal to noise ratio of 3 dB, a very audible deterioration in sound quality.

Finally, an attempt was made to test the circuit with no specific bias at the base of the transistor Q4, i.e. the base was allowed to "drift" as is the case in conventional circuits of this type. At the specified input level (1.4V) the circuit became unstable without bias at this point in the circuit.

EXAMPLE 2

A second example investigated the effect of varying the bias point at the base of the transistor Q3. Again, all other values in the circuit were kept constant. For these tests, the bias at the base of the transistor Q4 was set at 1.9V.

Figure 4:
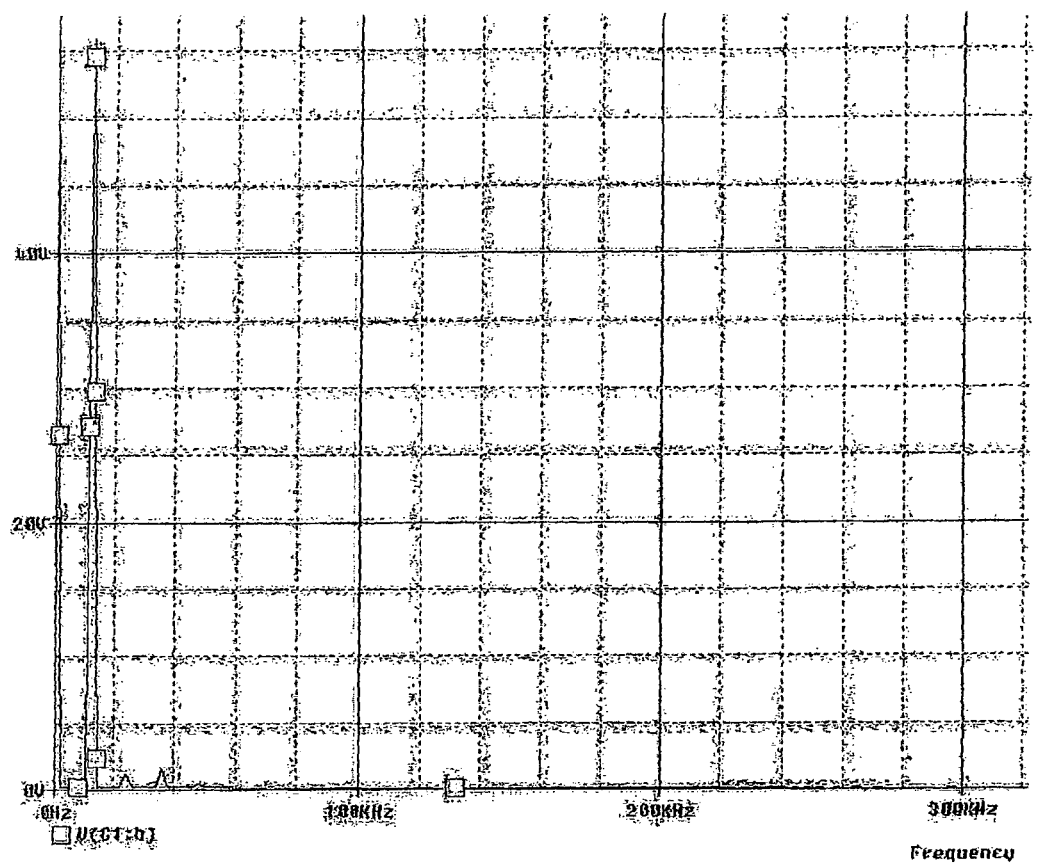

The bias at the base of Q3 was adjusted to 3.55V, which yielded the FFT plot of FIG. 4. Here, a signal to noise ratio of 31.1 dB was measured with an output waveform amplitude of 56V r.m.s.

Figure 5:
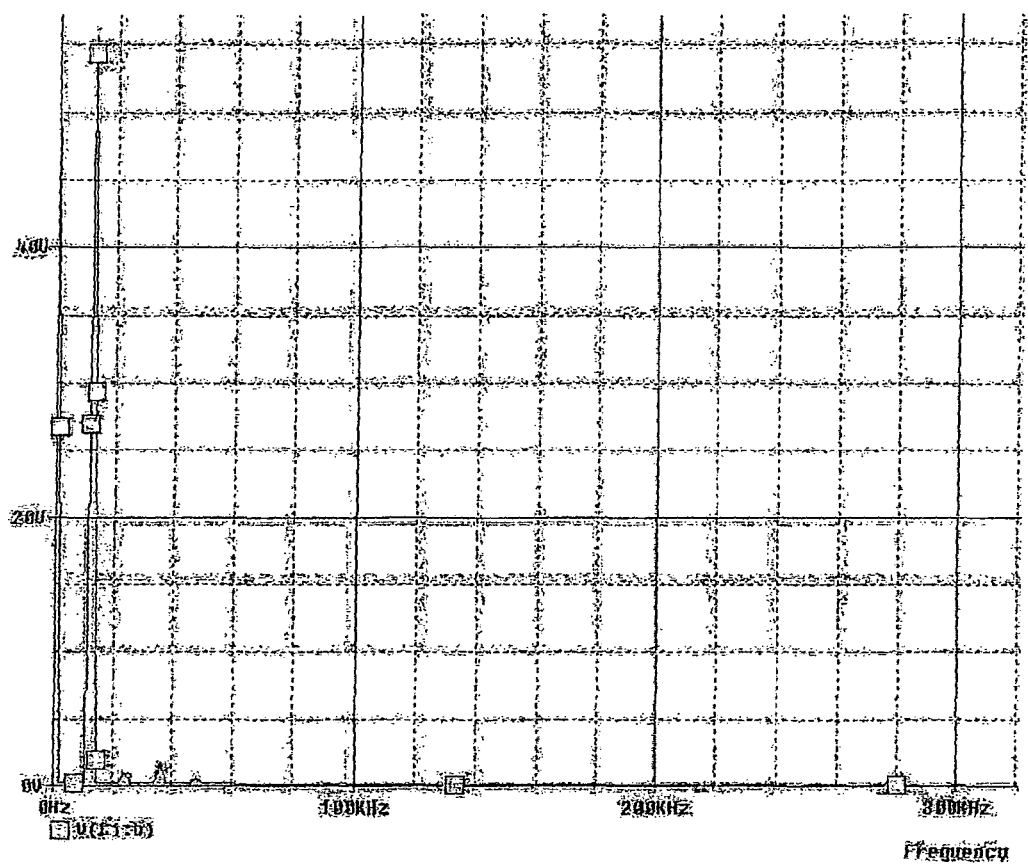
Figure 6:
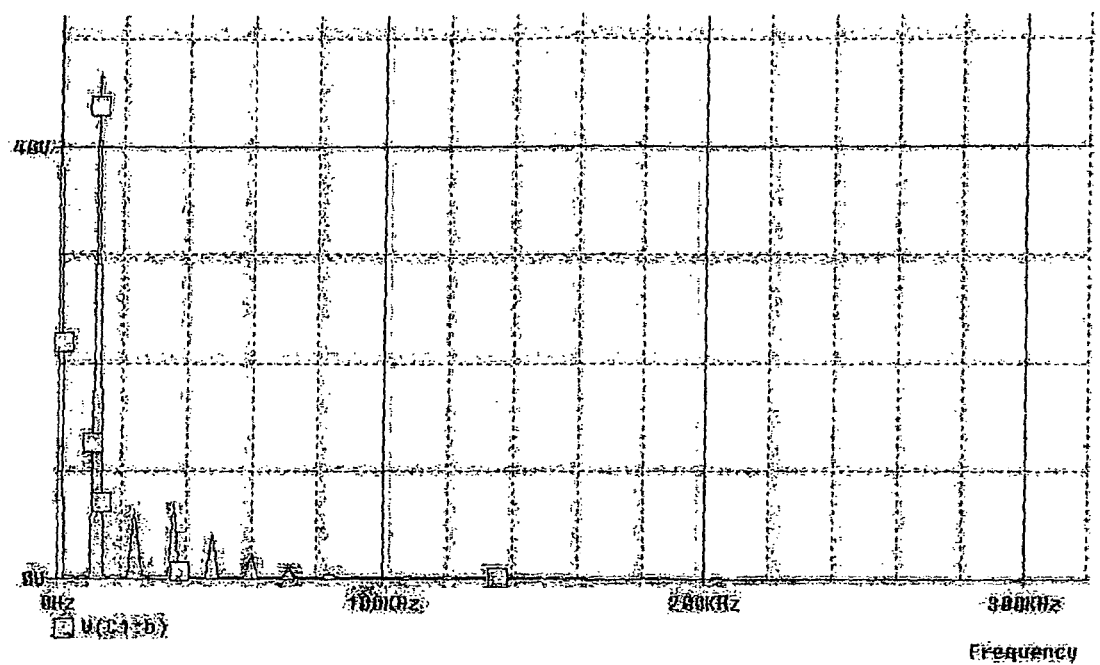

The bias was then adjusted to 3.3V, which yielded the FFT plot of FIG. 5. In this case, the signal to noise ratio was measured at 30.3 dB, with the output amplitude at 55.6V r.m.s. This was a small and not very significant change in distortion from a 7% change in bias level. However, going just more than 6% further, the bias was adjusted to 3.08V, yielding the FFT of FIG. 6. As can be seen clearly from the FFT analysis, the change is dramatic. Changing the bias level by only 6.7% from the previous value yields a signal to noise ratio of only 17.1 dB, a very substantial 13 dB worse than the previous test case. The output amplitude was reduced to only 46.5V r.m.s, 17% lower than the previous value.

As can be seen from the examples above, setting specific bias levels and the ability to measure the exact signal to noise ratio for a given bias setting are very important. Provided that the circuit is configured correctly with appropriate bias settings for the transistors chosen, it is possible to get extremely good fidelity at normal amplitude levels. In the above cases, the output level of the circuit is at maximum, yielding very high audio levels. At more normal output levels, it is possible to obtain a signal to noise ratio of approximately 60 dB, which means that the distortion is well below audible levels, without negative feedback.

As negative feedback causes significant phase problems in the output signal (the phase of the feedback signal is always incorrect with respect to the input signal as a result of propagation delay in the junctions of the transistors), the fact that such low circuit distortion can be attained without negative feedback is very important in audio applications, where phase distortion is manifested as a deterioration of the stereo image presented by the system.

The above described two stage cascode circuit provides an output impedance which is low enough to drive most output stage configurations in audio amplifiers. However, the configuration of the output stage is complicated as a result of the gain stage being class-A, with the result that the output signal at the output 12 is not biased around 0V but around approximately half the supply voltage, V1.

A suitable output stage circuit was designed as a practical solution to this problem, offering a low-distortion alternative to the problem of providing a voltage to current transducer in the audio spectrum. This output stage circuit is shown schematically in FIG. 7.

Figure 7:
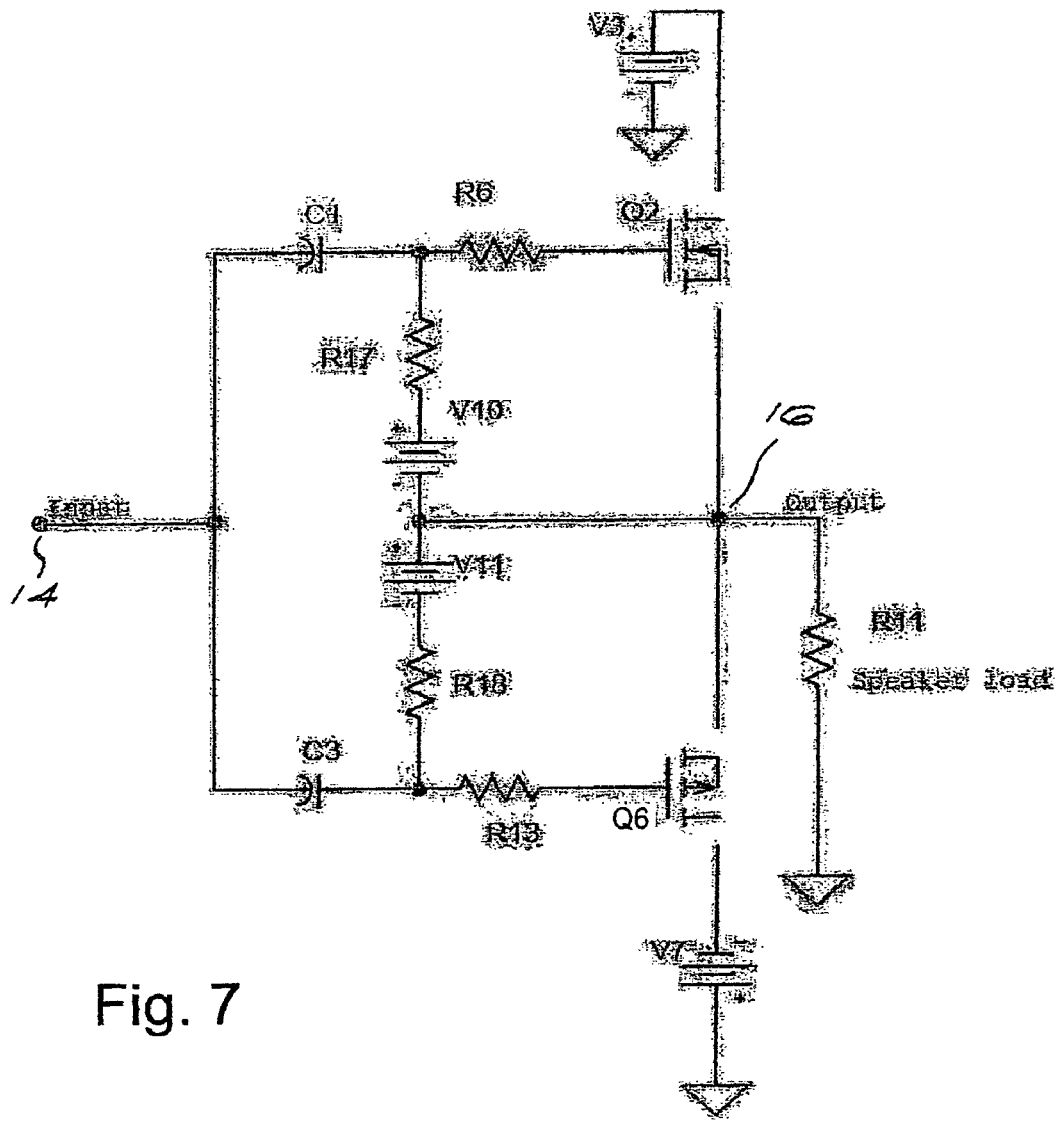
FIG. 7 is a schematic circuit diagram of an output stage circuit usable with the amplifier circuit of FIG. 1 to create a complete audio power amplifier.

In the circuit of FIG. 7, two coupling capacitors C1 and C3 are used at the input 14 to decouple the output of the class-A cascode gain stage in the AC domain, allowing the signal to be connected to the gates of two MosFETs Q2 and Q6 via gate resistors R6 and R13. These resistors may be chosen to limit the frequency bandwidth to an appropriate level-values of 500 to 6000 would be typical as this would limit the effective bandwidth to less than 100 kHz, more than adequate for an audio amplifier.

Gate bias to the MosFETs Q2 and Q6 is provided using a very simple DC bias circuit based on independent DC supplies V10 and V11, with suitable high value resistors R17 and R18 (typically several hundred kΩ being used to decouple this bias voltage from the input signal. In order to reference this bias value to the output signal of the MosFET stage, the supplies V10 and V11 are connected to the common of Q2 and Q6 which is the output point 16 of this stage. The supplies V10 and V11 must be very high quality regulated supplies, as any fluctuation in bias level will translate directly into distortion of the output signal.

The output devices Q2 and Q6 must be chosen to have appropriate current capability and voltage allowance to provide the required output signal amplitude. These devices are independently supplied with power through respective DC supplies V3 and W, which should have sufficient reserve (typically provided in the form of a large capacitor bank) so as to be able to supply peak power demand during operation without depletion.

A load resistor R11 is shown as a depiction of an idealized speaker load.

The described output stage as shown is configured as a near-unity (typically 0.95) gain stage which effectively operates as a voltage to current transducer, with the voltage waveform provided by the cascode gain stage being reflected at the output with very low output impedance and the ability to drive significant current into a speaker load (currents of 5 A or more are possible, given suitable power supplies V3 and V7, and suitable output devices).

Bias for the gates of the output devices must be set up so that zero-crossing distortion is minimized and the output is balanced at close to 0V offset from ground under quiescent conditions. Typical quiescent bias current at the source of the output device is set to approximately 70 mA to 150 mA, depending on requirements.

The described two-stage cascode circuit provides a high quality, low distortion gain stage which can be used as a building block in a high fidelity audio amplifier. The circuit uses no overall negative feedback and is suitable for use in high power amplifiers. The described output stage can be combined with the gain stage to produce a complete audio power amplifier having excellent performance.

What is claimed is:

1. An audio amplifier circuit comprising:
   a first cascode stage configured as a voltage gain stage and having an input for an audio signal, and an output;
   a second cascode stage configured as a unity gain or near unity gain stage and having an input to receive an output from the first cascode stage, and a low impedance output to drive an output stage of an audio power amplifier;
   the first cascode stage comprising a first, input transistor having an input biased to a predetermined bias voltage, and a second, output transistor arranged to drive the second cascode stage.

2. An audio amplifier circuit according to claim 1 wherein the first, input transistor of the first cascode stage has a common-emitter configuration, and the second, output transistor has a common-base configuration.

3. An audio amplifier circuit according to claim 1 wherein the bases of each transistor in the first cascode stage are biased independently to a predetermined DC bias voltage.

4. An audio amplifier circuit according to claim 1 wherein the input of the first cascode stage is isolated from the base of the first transistor by a capacitor.

5. An audio amplifier circuit according to claim 4 wherein the input of the first cascode stage is isolated from the base of the first transistor by a resistor.

6. An audio amplifier circuit according to claim 1 wherein the second cascode stage is configured as a White's cascode comprising two transistors, each being biased to a predetermined DC bias voltage.

7. An audio power amplifier comprising an audio amplifier circuit according to claim 1, and further comprising an output stage arranged to be driven by said audio amplifier circuit and configured as a unity or near-unity gain stage which effectively operates as a voltage to current transducer.

* * * * *